US011609287B2

(12) United States Patent
Schneiderbanger et al.

(10) Patent No.: US 11,609,287 B2
(45) Date of Patent: Mar. 21, 2023

(54) SAFETY STRUCTURE OF A MAGNETIC RESONANCE APPARATUS

(71) Applicant: Siemens Healthcare GmbH, Erlangen (DE)

(72) Inventors: Dirk Schneiderbanger, Langensendelbach (DE); Axel Friedrich, Nuremberg (DE); Daniel Scheit, Erlangen (DE); Christian Plewa, Erlangen (DE); Lennart Kilian, Gauting (DE); Helmut Lenz, Oberasbach (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/319,043

(22) Filed: May 12, 2021

(65) Prior Publication Data
US 2021/0356538 A1    Nov. 18, 2021

(30) Foreign Application Priority Data
May 13, 2020    (DE) .................. 10 2020 206 063.0

(51) Int. Cl.
*G01V 3/00* (2006.01)
*G01R 33/28* (2006.01)
(Continued)

(52) U.S. Cl.
CPC ....... *G01R 33/288* (2013.01); *G01R 33/3852* (2013.01); *G01R 33/543* (2013.01)

(58) Field of Classification Search
USPC ......................................................... 324/318
See application file for complete search history.

(56) References Cited

U.S. PATENT DOCUMENTS 4,583,170 A * 4/1986 Carlin .................. E21B 43/12
700/83
2007/0060047 A1* 3/2007 Ono ...................... H04B 7/2606
455/11.1
(Continued)

FOREIGN PATENT DOCUMENTS

CN          202677237 U   *  1/2013
DE      102016206398 A1     10/2017
DE      102017219907 B3     10/2018

OTHER PUBLICATIONS

International Standard, Edition 3.0; Dec. 2005; "Medical electrical equipment" IEC 60601-1. ISBN 2-8318-8400-4. 2005. pp. 1-792.
(Continued)

*Primary Examiner* — Walter L Lindsay, Jr.
*Assistant Examiner* — Frederick Wenderoth
(74) *Attorney, Agent, or Firm* — Lempia Summerfield Katz LLC

(57) ABSTRACT

A magnetic resonance apparatus with a safety structure for monitoring a safety-related function is provided. The safety structure includes a control path that is configured to control the safety-related function, and a first protect path and a second protect path. The first protect path and the second protect path are configured to acquire a safety-related parameter of the safety-related function. The first protect path is configured to identify a hazardous situation, independently of the control path and the second protect path, based on the safety-related parameter that the first protect path acquires. The second protect path is configured to identify a hazardous situation, independently of the control path and the first protect path, based on the safety-related parameter that the second protect path acquires. The first
(Continued)

protect path and the second protect path are each configured to transfer the magnetic resonance apparatus into a safe state in a hazardous situation.

20 Claims, 5 Drawing Sheets

(51) Int. Cl.
*G01R 33/385* (2006.01)
*G01R 33/54* (2006.01)

(56) References Cited

U.S. PATENT DOCUMENTS

| | | |
|---|---|---|
| 2017/0059670 A1* | 3/2017 | Gebhardt ............... G01R 33/24 |
| 2017/0299667 A1 | 10/2017 | Bielmeier et al. |
| 2018/0074138 A1 | 3/2018 | Bielmeier et al. |
| 2018/0140871 A1* | 5/2018 | Konofagou ............. A61N 7/02 |
| 2019/0137580 A1 | 5/2019 | Lenz et al. |

OTHER PUBLICATIONS

International Standard, First Edition; May 2006; "Medical device software—Software life cycle processes" CEI/IEC 62304:2006. pp. 1-164.
German Office Action for German Application No. 10 2020 206 063.0 dated Apr. 16, 2021.

* cited by examiner

FIG 3
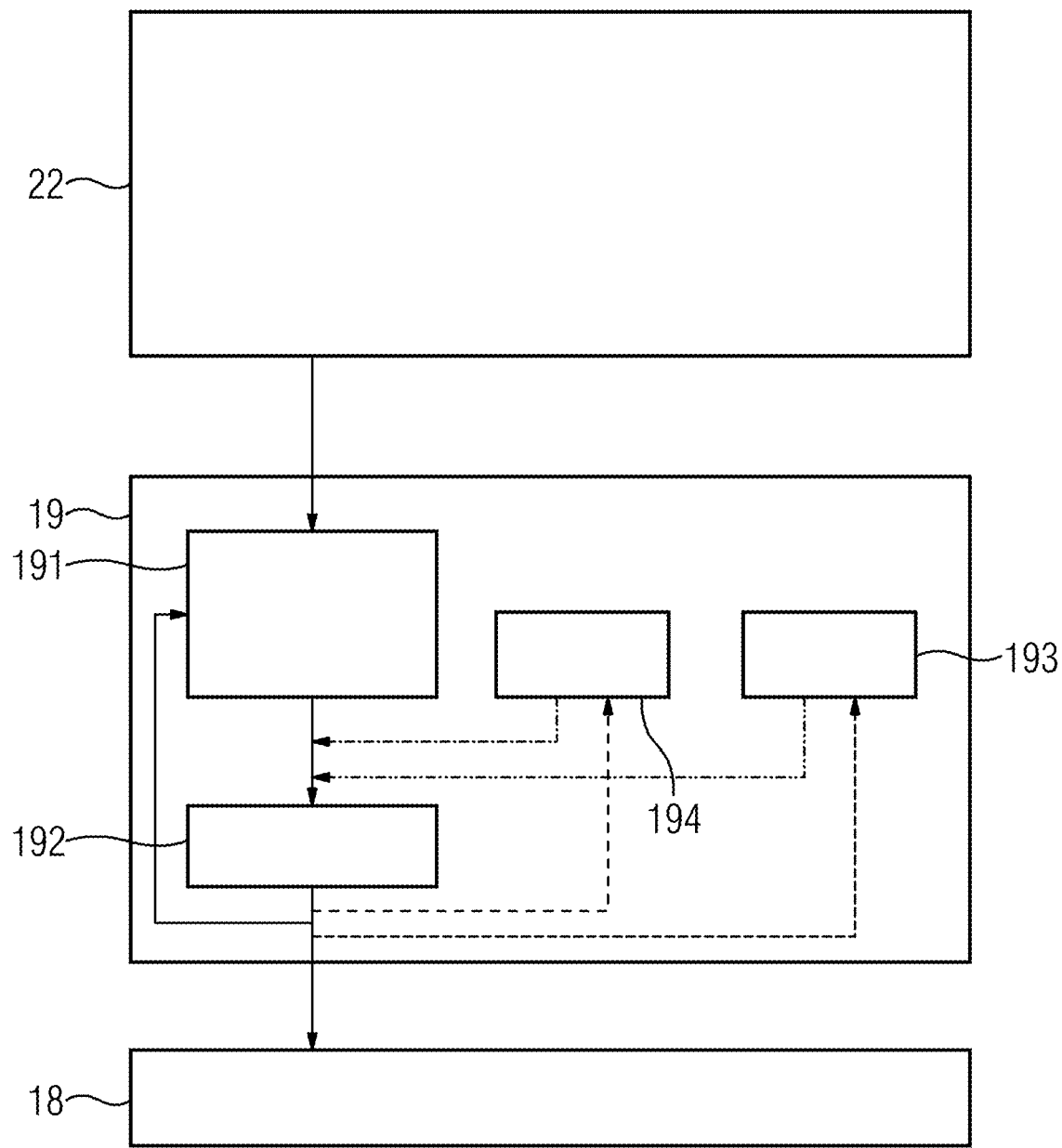
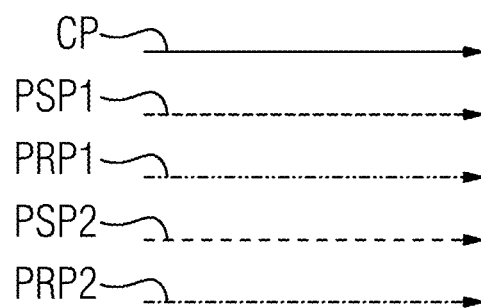

FIG 4
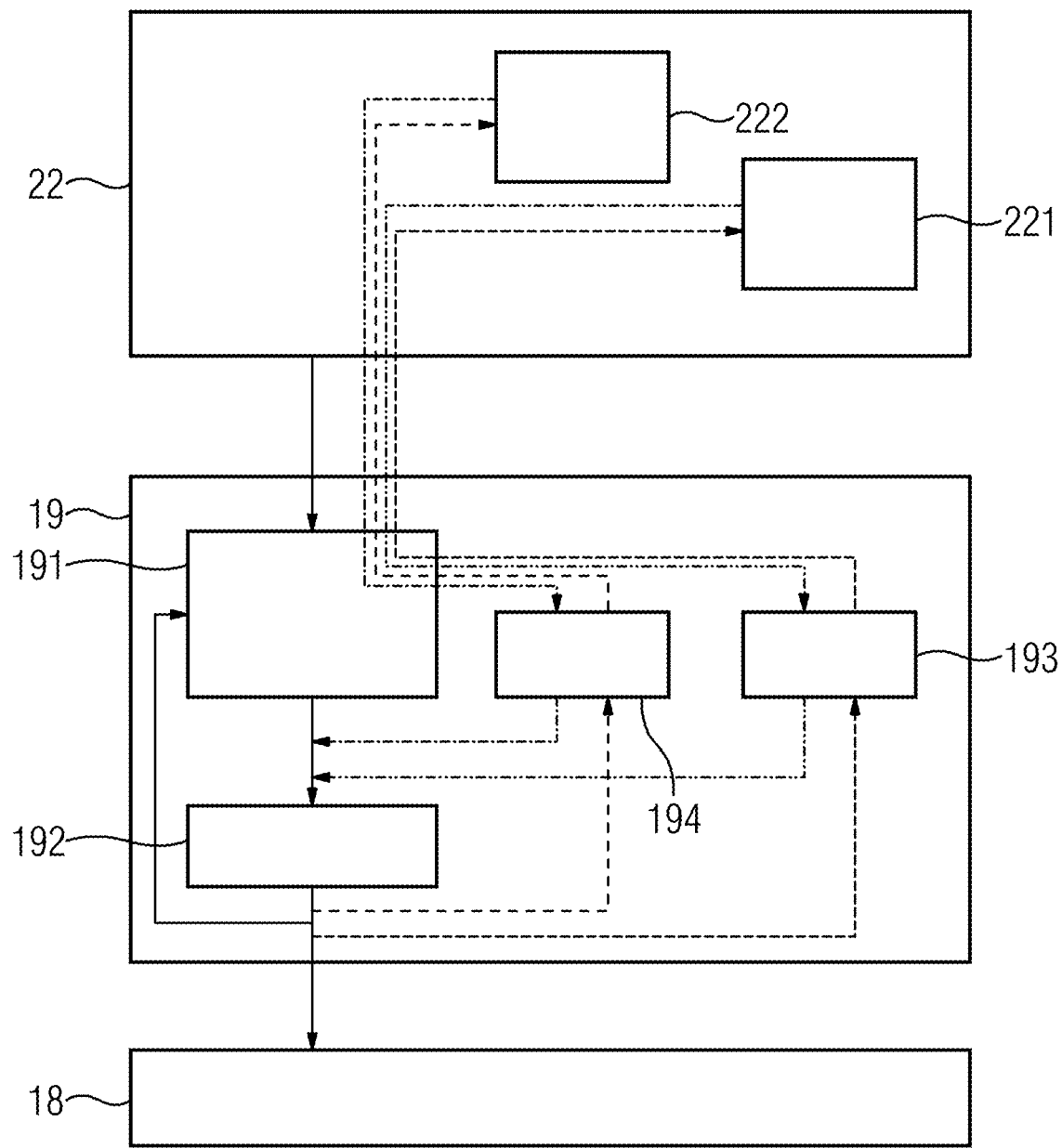
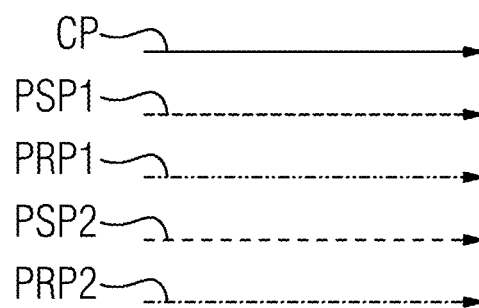

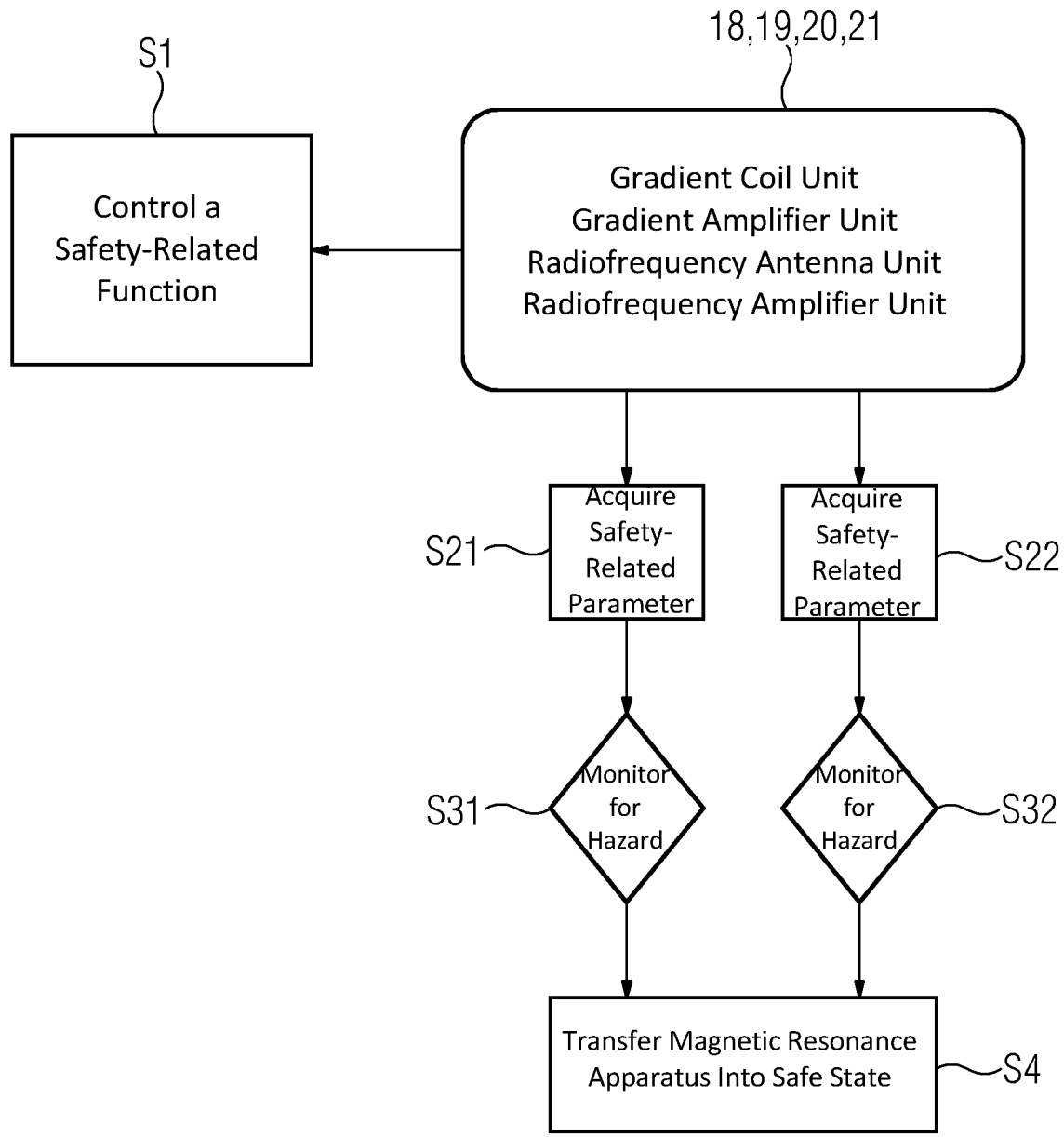

SAFETY STRUCTURE OF A MAGNETIC RESONANCE APPARATUS

This application claims the benefit of German Patent Application No. DE 10 2020 206 063.0, filed on May 13, 2020, which is hereby incorporated by reference in its entirety.

BACKGROUND

The present embodiments relate to a magnetic resonance apparatus with a safety structure for monitoring a safety-related function of the magnetic resonance apparatus, as well as a method for monitoring a safety-related function of a magnetic resonance apparatus.

During a magnetic resonance examination of a patient (e.g., when performing magnetic resonance tomography (MRT) or magnetic resonance imaging (MRI), magnetic fields (e.g., gradient fields) and radiofrequency signals or radiofrequency fields may be used in accordance with a scanning protocol in order to acquire magnetic resonance signals by way of a magnetic resonance apparatus. In order to generate the gradient fields, the magnetic resonance apparatus usually has at least one gradient coil that is fed by at least one gradient amplifier. Further, the magnetic resonance apparatus may include at least one radiofrequency antenna, with which the radiofrequency signals may be generated in order to excite atomic nuclei; the at least one radiofrequency antenna may be fed by at least one radiofrequency amplifier.

As the performance capability of the magnetic resonance apparatus increases with regard to gradient strength and radiofrequency output, hazards may be produced for the patient (e.g., by stimulating the heart muscle of the patient as a consequence of induced voltage in the tissue due to powerful temporary magnetic field gradients and/or overheating the tissue of the patient due to powerful irradiated radiofrequency output).

A further complication is that any implants located in the body of the patient may bundle both magnetic fields and radiofrequency fields locally (e.g., by acting as passive antennas). This may lead to a local field magnification, providing that higher field strengths may occur in the body of the patient than in the case without an implant.

For the operation of a magnetic resonance apparatus, it is therefore important, for example, to restrict the slew rate of the gradient field or the output of the radiofrequency signal.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a safety structure of a magnetic resonance apparatus that monitors safety-related functions effectively and efficiently is provided.

A magnetic resonance apparatus with a safety structure for monitoring a safety-related function of the magnetic resonance apparatus is provided. In this context, the safety structure includes a control path that is configured to control the safety-related function, as well as a first protect path and a second protect path. Both the first protect path and the second protect path are configured to acquire at least one safety-related parameter of the safety-related function. In addition, the first protect path is configured to identify a hazardous situation, independently of the control path and the second protect path, based on the safety-related parameter that the first protect path acquires.

Further, the second protect path is configured to identify a hazardous situation, independently of the control path and the first protect path, based on the safety-related parameter that the second protect path acquires.

A safety-related function is, for example, an operating unit of the magnetic resonance apparatus that acts upon a patient in a potentially hazardous manner. The patient may be acted upon, for example, in the form of an influx of heat into the patient and/or a stimulation (e.g., a nerve and/or muscle stimulation) of the patient. The safety-related function may, for example, include a function chain (e.g., a gradient chain or a radiofrequency chain), the elements of which contribute toward a possible hazard for the patient.

The control path, for example, includes elements that contribute toward a controlled operation of the safety-related function. For example, the control path implements the safety-related function.

For example, the control path includes a control unit (e.g., a controller; one or more processors) that is configured to receive and process input signals and to transmit output signals. The input signals may include setpoint values, for example, for performing an imaging magnetic resonance sequence. Further, the input signals may include actual values, for example, that characterize the actual state of the safety-related function. In one embodiment, the control unit is configured to perform a closed-loop control of the safety-related function (e.g., based on the setpoint values and actual values).

The first path and the second protect path, for example, include elements that contribute toward monitoring the safety-related function. For example, the first protect path and the second protect path include sensors and/or detectors for acquiring the at least one safety-related parameter.

The at least one safety-related parameter acquired by the first protect path and the second protect path may be the same parameter. For example, the at least one safety-related parameter acquired by the first protect path may be a gradient current, and the at least one safety-related parameter acquired by the second protect path may also be a gradient current. The at least one safety-related parameter acquired by the first protect path and the second protect path may also, however, be different parameters. For example, the at least one safety-related parameter acquired by the first protect path may be a first parameter, and the at least one safety-related parameter acquired by the second protect path may be a second parameter that is different from the first parameter.

In one embodiment, the first protect path and/or the second protect path monitor the control path or the safety-related parameters of the safety-related function. The safety-related parameters are, for example, safety-related system variables of the magnetic resonance apparatus.

In one embodiment, function tests are performed regularly in order to detect latent faults. This makes it possible to identify hidden faults in the first protect path and/or the second protect path.

The temporal spacing between the function tests amounts to, for example, 3 to 15 days (e.g., 5 to 10 days). The temporal spacing between the function tests may be chosen such that what is known as a multiple fault tolerance time (MFTT) is not exceeded. MMTT usually refers to a time, within which an occurrence of two mutually independent faults is sufficiently unlikely. For example, the MFTT may be dependent upon the failure rates of the electronic parts used.

For example, it is possible to reduce the risk that an individual fault and follow up faults lead to a hazardous state of the system. By way of the regular function tests, a possible first random fault (e.g., a latent fault that is not noticed immediately and automatically) may be identified before a possible second random fault occurs. A latent fault may, for example, include the failure of an electronic part or an entire subassembly.

In one embodiment, available hardware of the magnetic resonance apparatus and/or additional software routines are used for detecting the latent faults. In one embodiment, the magnetic resonance apparatus (e.g., hardware and most of the software) performs customary functions (e.g., configured with specific test parameters as appropriate) during the regular function tests. In one embodiment, the magnetic resonance apparatus includes dedicated hardware that is only activated for the regular function tests.

In accordance with the safety structure proposed, the safety-related function is not only monitored by a protect path, but rather by two independent protect paths. As a result, the safety requirements for the control path, which may be complex, may be lowered. The control path may be relieved of ensuring the functional safety and therefore may be configured with a lower integrity. As a result, it may be made possible that the control path does not have to be included in an elaborate demonstration of technical safety. In order to be able to perform control tasks, the control path is often configured in a highly complex manner, providing that the control path mostly has quite a lot of state space to be scanned. For this reason, a lowering of the safety requirements placed on the control path leads to a considerable reduction of the overall outlay during development (e.g., initial development and further development, such as part of updates, upgrades, etc.) and during production of the magnetic resonance apparatus.

In one embodiment, the first protect path and/or the second protect path is configured in accordance with a safety category that has higher security requirements than a safety category, in accordance with which the control path is configured.

For example, software development relating to the first protect path and/or the second protect path is performed in accordance with a safety class C according to IEC 62304, while software development relating to the control path is performed in accordance with a safety class with lower requirements.

In one embodiment, the first protect path and/or the second protect path are configured to transfer the magnetic resonance apparatus into a safe state if a hazardous situation is identified. For example, the first protect path and the second protect path are configured to deactivate the safety-related function. In one embodiment, the first protect path and the second protect path are configured independently of one another.

A further embodiment of the magnetic resonance apparatus provides that the control path, the first protect path, and/or the second protect path have no overlap, or that the safety structure has a way for identifying a fault at the overlaps if the control path, the first protect path, and/or second protect path have at least one overlap.

For example, the way for identifying a fault includes at least one channel that is suitably encoded to identify faults on a transfer path of the overlap.

For example, where the first protect path and/or the second protect path and/or the control path use a shared piece of hardware or shared logical channel, the first protect path and/or the second protect path run in a suitably encoded channel that allows faults on the transfer path to be identified immediately (e.g., by establishing a safety layer via a gray channel, such as a fault-prone channel).

A further embodiment of the magnetic resonance apparatus provides that the magnetic resonance apparatus includes a system control unit separate from the safety-related function, where the system control unit includes at least one central monitoring unit for monitoring the first and/or the second protect path. For example, the central monitoring unit may be part of the first protect path and/or the second protect path.

The system control unit is, for example, a unit that is configured to control multiple functions of the magnetic resonance apparatus. At least some of these multiple functions may be safety-related functions. The multiple functions may, for example, include the generation of a gradient field and/or the generation of a radiofrequency field. The system control unit may include one or more processors and/or one or more data memories with program means for performing a system control.

A further embodiment of the magnetic resonance apparatus provides that the safety-related function includes at least one local monitoring unit for monitoring the first protect path and/or the second protect path. For example, the at least one local monitoring unit may be part of the first protect path and/or the second protect path. In one embodiment, the local monitoring unit is arranged in an amplifier unit (e.g., a gradient amplifier unit or a radiofrequency amplifier unit). In one embodiment, the local monitoring unit is arranged outside the system control unit.

A further embodiment of the magnetic resonance apparatus provides that only the first protect path has a central monitoring unit and only the second protect path has a local monitoring unit.

A further embodiment of the magnetic resonance apparatus provides that the first protect path has a first central monitoring unit and the second protect path has a second central monitoring unit. For example, in this context, neither the first protect path nor the second protect path has a local monitoring unit.

In a further embodiment, the first protect path has a first local monitoring unit and the second protect path has a second local monitoring unit. For example, in this context, neither the first protect path nor the second protect path has a central monitoring unit.

A further embodiment of the magnetic resonance apparatus provides that the at least one central monitoring unit or the at least one local monitoring unit includes at least one programmable logic element. For example, the at least one central or local monitoring unit includes a programmable logic element or a combination of multiple programmable logic elements.

A programmable logic element may, for example, be a microcontroller (μC), a digital signal processor (DSP), a field-programmable gate array (FPGA), or a complex programmable logic device (CPLD).

The safety-related function may relate to a generation of a magnetic field and/or a radiofrequency signal, for example.

For example, for generating the magnetic field, the magnetic resonance apparatus may include at least one gradient amplifier (e.g., gradient power amplifier (GPA)) and at least one gradient coil. The at least one gradient amplifier is configured to supply the at least one gradient coil with a gradient current, and the at least one safety-related parameter characterizes the gradient current.

In one embodiment, the magnetic resonance apparatus is configured to generate a gradient field with a slew rate of at least 200 T/m/s. Especially in such high-performance gradient systems, it is important to be able to identify hazardous situations reliably.

For example, for generating the radiofrequency signal, the magnetic resonance apparatus may include at least one radiofrequency amplifier (e.g., radiofrequency power amplifier (RFPA)) and at least one radiofrequency antenna. The at least one radiofrequency amplifier is configured to supply the at least one radiofrequency antenna with a radiofrequency output. The at least one safety-related parameter characterizes the radiofrequency output.

Further, a method for monitoring a safety-related function of a magnetic resonance apparatus is provided.

The advantages of the method for monitoring a safety-related function of a magnetic resonance apparatus correspond substantially to the advantages of the magnetic resonance apparatus with a safety structure for monitoring a safety-related function of the magnetic resonance apparatus, which have been described in detail above. Features, advantages, or alternative embodiments mentioned herein may likewise also be transferred to the other subject matters and vice versa.

In the method for monitoring a safety-related function of a magnetic resonance apparatus, a control path controls a safety-related function. Further, a first protect path and a second protect path each acquire at least one safety-related parameter of the safety-related function. The first protect path identifies a hazardous situation, independently of the control path and second protect path, based on the safety-related parameter acquired by the first protect path, and/or the second protect path identifies a hazardous situation, independently of the control path and first protect path, based on the safety-related parameter acquired by the second protect path.

In one embodiment, the first protect path and/or the second protect path transfers the magnetic resonance apparatus into a safe state if a hazardous situation is identified.

In one embodiment, the first protect path and/or the second protect path are tested (e.g., regularly) with regard to hidden faults.

In one embodiment, at least one gradient amplifier of the magnetic resonance apparatus supplies at least one gradient coil of the magnetic resonance apparatus with a gradient current. The first protect path and the second protect path each acquire a safety-related parameter that characterizes the gradient current.

In one embodiment, at least one radiofrequency amplifier of the magnetic resonance apparatus supplies at least one radiofrequency antenna of the magnetic resonance apparatus with a radiofrequency output. The first protect path and the second protect path each acquire a safety-related parameter that characterizes the radiofrequency output.

Further advantages, features, and details of the present embodiments are disclosed in the following description of exemplary embodiments and with reference to the drawings. Parts that correspond to one another are provided with the same reference characters in all the figures.

BRIEF DESCRIPTION OF THE DRAWINGS

FIG. 3 shows one embodiment of a safety structure with two local monitoring units;

FIG. 4 shows one embodiment of a safety structure with two central monitoring units; and FIG. 5 shows one embodiment of a method for monitoring a safety-related function of a magnetic resonance apparatus.

DETAILED DESCRIPTION

Figure 1:
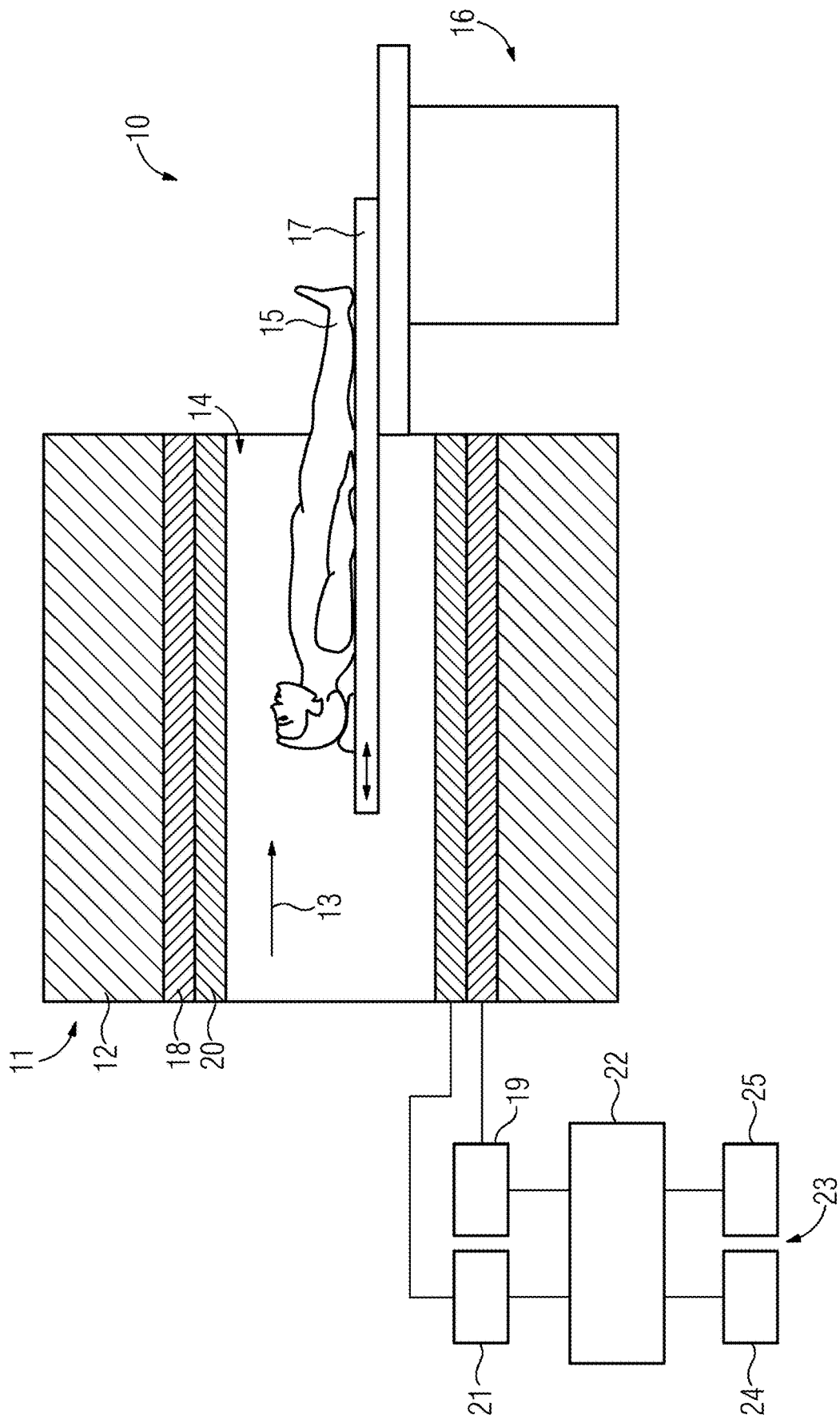
FIG. 1 shows one embodiment of a magnetic resonance apparatus with a safety structure for monitoring a safety-related function of the magnetic resonance apparatus.

FIG. 1 shows a schematic representation of one embodiment of a magnetic resonance apparatus 10. The magnetic resonance apparatus 10 includes a magnet unit 11 that has a main magnet 12 for generating a powerful main magnetic field 13 that is, for example, constant over time. The magnetic resonance apparatus 10 also includes a patient receiving region 14 for accommodating a patient 15. In the present exemplary embodiment, the patient receiving region 14 is shaped as a cylinder and is enclosed in a circumferential direction cylindrically by the magnet unit 11. The patient receiving region 14 may, however, have a different design. The patient 15 may be moved into the patient receiving region 14 by a patient positioning apparatus 16 of the magnetic resonance apparatus 10. For this purpose, the patient positioning apparatus 16 has a patient table 17 that is configured to be movable within the patient receiving region 14.

In order to generate gradient fields, the magnet unit 11 also includes a gradient coil unit 18 that includes at least one gradient coil. The gradient fields are used for spatial encoding during an imaging. The gradient coil unit 18 is operated by the gradient amplifier unit 19, which includes at least one gradient amplifier. The magnet unit 11 also includes a radiofrequency antenna unit 20 with at least one radiofrequency antenna that, in the present exemplary embodiment, is configured as a body coil that is integrated in the magnetic resonance apparatus 10 in a fixed manner. The radiofrequency antenna unit 20 is configured to excite atomic nuclei. The excitation is established in the main magnetic field 13 generated by the main magnet 12. The radiofrequency antenna unit 20 radiates radiofrequency magnetic resonance sequences into an examination space that is substantially formed by a patient receiving region 14 of the magnetic resonance apparatus 10. The radiofrequency antenna unit 20 is operated by a radiofrequency amplifier unit 21 that includes at least one radiofrequency amplifier. The radiofrequency antenna unit 20 is also configured to receive magnetic resonance signals.

The magnetic resonance apparatus 10 has a system control unit 22 for controlling the gradient amplifier unit 19 and for controlling the radiofrequency amplifier unit 21. The system control unit 22 centrally controls the magnetic resonance apparatus 10 (e.g., the performance of a predetermined imaging gradient echo sequence). In addition, the system control unit 22 includes an evaluation unit (not shown in detail) for evaluating medical image data that is acquired during the magnetic resonance examination. Further, the magnetic resonance apparatus 10 includes a user interface 23 that is connected to the system control unit 22. Control information such as, for example, imaging parameters and reconstructed magnetic resonance images may be displayed on a display unit 24 (e.g., on at least one monitor) of the user interface 23 for medical operating personnel. In addition, the user interface 23 has an input unit 25 by which information and/or parameters may be input by the medical operating personnel during a scanning procedure.

Figure 2:
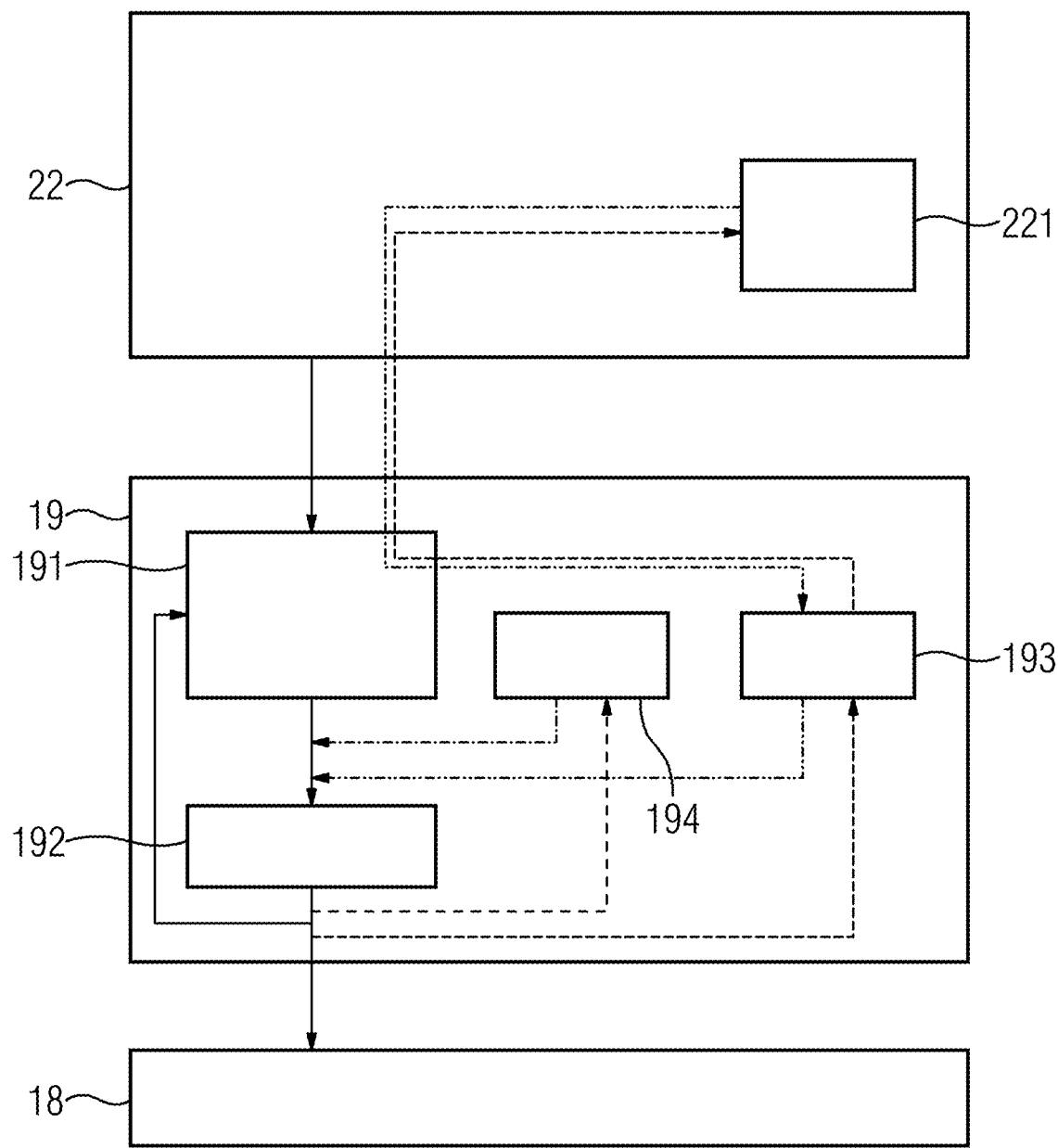
FIG. 2 shows one embodiment of a safety structure with a local and a central monitoring unit.

In FIGS. 2-4, various examples of a safety structure of the magnetic resonance apparatus 10 for monitoring a safety-related function are shown. In this context, the present embodiments are explained based on the gradient chain including the gradient coil unit 18 and the gradient amplifier unit 19 as a safety-related function of the magnetic resonance apparatus 10.

The present embodiments may also, however, similarly be applied without difficulty to the radiofrequency chain including the radiofrequency antenna unit 20 and the radiofrequency amplifier unit 21 (e.g., the radiofrequency antenna unit 20 then corresponds to the gradient coil unit 18, and the radiofrequency amplifier unit 21 then corresponds to the gradient amplifier unit 19). Radiofrequency amplifier unit 21 and gradient amplifier unit 19 are amplification units, and radiofrequency antenna unit 20 and gradient coil unit 18 are field generation units. The radiofrequency output of the radiofrequency antenna unit 20 corresponds to the gradient current flowing through the gradient coil unit 18. The radiofrequency output and the gradient current may be characterized by at least one safety-related parameter in each case.

The setpoint values of the gradient currents are assigned to the gradient amplifier unit 19 by the magnetic resonance apparatus 10 (e.g., the system control apparatus 22). The gradient amplifier unit 19 plays out the gradient currents to the at least one gradient coil of the gradient coil unit 18. The gradient amplifier unit 19 includes a control core 191 that has a closed-loop control for the gradient currents, and at least one output stage 192 (e.g., a power stage). The control core 191 may consist of or include one or more programmable logic elements. A programmable logic element may, for example, be a microcontroller (μC), a digital signal processor (DSP), a field-programmable gate array (FPGA), or a complex programmable logic device (CPLD). The control core may transmit a manipulated variable to an output stage 192, which ultimately generates the gradient current with which the gradient coil unit 18 is operated. The actual value of the gradient current is transmitted as a feedback signal to the control core 191 for the closed-loop control of the gradient current. The overall control path CP extends from the system controller 22, via the gradient amplifier unit 19, to the gradient coil unit 18.

The safety structure includes a control path CP that is configured to control or implement the safety-related function, a first protect path, and a second protect path. The first protect path has a first identification protect path PSP1 and a first reaction protect path PRP1. The second protect path has a second identification protect path PSP2 and a second reaction protect path PRP2. The gradient amplifier unit 19 further includes a first protect core 193 and a second protect core 194. The first protect core 193 and/or the second protect core 194 may in each case consist of or include one or more programmable logic elements.

The first protect path PSP1, PRP1 (e.g., the first identification protect path PSP1) and the second protect path PSP2, PRP2 (e.g., the second identification protect path PSP2) are in each case configured to acquire at least one safety-related parameter of the safety-related function. In one embodiment, the first identification protect path PSP1 and/or the second identification protect path PSP2 transmit actual values of the gradient current to the first protect core 193 or the second protect core 194. The actual values of the gradient current may be acquired by current sensors (not shown here), for example.

The first protect path PSP1, PRP1 is configured to identify a hazardous situation, independently of the control path CP and the second protect path PSP2, PRP2, based on the safety-related parameter that the first protect path PSP1, PRP1 acquires. The second protect path PSP2, PRP2 is configured to identify a hazardous situation, independently of the control path CP and the first protect path PSP1, PRP1, based on the safety-related parameter that the second protect path PSP2, PRP2 acquires.

In the variant shown in FIG. 3 with two local monitoring units, the identification takes place in the two protect cores 193 and 194. In the variant shown in FIG. 2 with a central monitoring unit 221 and a local monitoring unit, the identification takes place in one of the two protect cores 194. In this context, the other protect core 193 forwards the data to the central monitoring unit 221. In the variant shown in FIG. 4, the identification takes place in the two central monitoring units 221 and 222. In this context, each of the two protect cores 193 and 194 forwards data to the assigned central monitoring unit.

The monitoring of the safety-related function is intended to restrict the slew rate of the gradient field or the slew rate of the gradient current emitted by the gradient amplifier 19 (e.g., due to the rigid coupling between electrical current and magnetic field provided by the gradient coil unit 18). In the case of the safety-related function relating to the radiofrequency chain, the electrical output of the radiofrequency signal emitted by the radiofrequency amplifier 21 is to be restricted accordingly.

Systematic faults may be minimized in the development process of the magnetic resonance apparatus by intensive reviews and type testing (e.g., unit test, integration test, system test, etc.). In one embodiment, random faults (e.g., resulting from part failure, power failure, etc.) in the control path CP are discovered by the first protect path (e.g., the first identification protect path PSP1) and/or second protect path (e.g., the first identification protect path PSP2). In one embodiment, there are regular function tests for detecting latent faults. Hidden and/or random faults in the protect paths PSP1, PRP1, PSP2, PRP2 may be identified in this way.

Faults that may impair both the control path CP and also the protect paths PSP1, PRP1, PSP2, PRP2 may simultaneously be intercepted by suitable measures (e.g., electrical segregation, voltage monitoring, secured information channels by way of which falsification along the transfer paths may be identified by the receiver, watchdogs, etc.).

In the safety structure shown in FIG. 2, the system control unit 22 has a central monitoring unit 221 that is separated from the safety-related function.

In one embodiment, the first protect path PSP1, PRP1 includes the central monitoring unit 221 and the first protect core 193 as the providing instance (e.g., when transmitting the actual value of the gradient current to the central monitoring unit 221 via the first identification protect path PSP1). For example, when a hazardous situation is identified, the first protect core 193 provides a signal via the first reaction protect path PRP1 in order to transfer the magnetic resonance apparatus 10 into a safe state.

In one embodiment, the second protect path PSP2, PRP2 includes the second protect core 194. In this context, the second protect core 194 includes a local monitoring unit for monitoring the second protect path PSP2, PRP2. The actual value of the gradient current may be transmitted to the local monitoring unit via the second identification protect path PSP2. If the local monitoring unit identifies a hazardous situation, then the magnetic resonance apparatus 10 may be transferred into a safe state by the second reaction protect path PRP2.

A further variant of a safety structure is shown in FIG. 3. In FIG. 3, the system control unit 22 does not include a central monitoring unit, but instead, each of the first protect core 193 and the second protect core 194 includes a local monitoring unit.

In accordance with the variant shown in FIG. 4, the system control unit 22 includes two central monitoring units 221, 222. Both the first protect core 193 and the second protect core 194 act as providing instances for the respective central monitoring unit (e.g., the first protect core 193 communicates with the central monitoring unit 221, and the second first protect core 194 communicates with the central monitoring unit 222).

What all variants have in common is that the control path CP does not have to be involved in the demonstration of technical safety due to the redundancy of the protect paths PSP1, PRP1, PSP2, PRP2. The initial and recurring outlay for demonstrating technical safety may therefore be considerably reduced: the control path CP, which is generally highly complex, does not require a high level of integrity. This provides that less outlay is incurred for voltage monitoring, etc. in the control path. Further, the control path does not require software development (e.g., firmware development) in accordance with the relatively high safety class B according to IEC 62304 (e.g., initially or in the case of changes). Additionally, outlay for tests may be significantly reduced (e.g., during an integration test or system test, both initially and in the case of changes, which are needed relatively often in the control path).

Although the protect paths PSP1, PRP1, PSP2, PRP2 may have a relatively high level of integrity, the protect paths PSP1, PRP1, PSP2, PRP2 have a limited technical complexity (e.g., generally considerably lower than in the case of the control path; a comparatively small amount of state space to be scanned). Further, protect paths PSP1, PRP1, PSP2, PRP2 may be changed only rarely.

FIG. 5 shows one embodiment of a method for monitoring a safety-related function of a magnetic resonance apparatus. In act S1, a control path controls a safety-related function. The safety-related function may, for example, relate to the gradient chain including the gradient coil unit 18 and the gradient amplifier unit 19 or the radiofrequency chain including the radiofrequency antenna unit 20 and the radiofrequency amplifier unit 21.

In act S21, a first protect path acquires at least one safety-related parameter of the safety-related function. In act S22, a second protect path acquires at least one safety-related parameter of the safety-related function.

In act S31, the first protect path monitors whether a hazardous situation is present based on the at least one safety-related parameter. Independently of this, in act S32, the second protect path monitors whether a hazardous situation is present based on the at least one safety-related parameter. If a hazardous situation is present, then in act S4, the magnetic resonance apparatus is transferred into a safe state.

The method described above and the magnetic resonance apparatus disclosed are merely exemplary embodiments that may be modified by a person skilled in the art in a broad variety of ways without departing from the scope of the invention. In addition, the use of the indefinite article "a" or "an" does not preclude the relevant features also being present plurally. Similarly, the expression "unit" does not preclude the relevant components consisting of a plurality of cooperating subcomponents that may also be spatially distributed if necessary.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance apparatus comprising:
 a safety structure for monitoring a safety-related function of the magnetic resonance apparatus, the safety structure comprising:
  a control path that is configured to control the safety-related function;
  a first protect path; and
  a second protect path,
 wherein the first protect path and the second protect path are each configured to acquire at least one safety-related parameter of the safety-related function,
 wherein the first protect path is configured to identify a first hazardous situation, independently of the control path and the second protect path, based on the at least one safety-related parameter that the first protect path acquires,
 wherein the second protect path is configured to identify a second hazardous situation, independently of the control path and the first protect path, based on the at least one safety-related parameter that the second protect path acquires, and
 wherein the first protect path, the second protect path, or the first protect path and the second protect path are configured in accordance with a safety category that has higher security requirements than a safety category, in accordance with which the control path is configured.

2. A method for monitoring a safety-related function of a magnetic resonance apparatus, the method comprising:
 controlling, by a control path, a safety-related function;
 acquiring, by each of a first protect path and a second protect path, at least one safety-related parameter of the safety-related function,
 identifying, by the first protect path, a hazardous situation, independently of the control path and second protect path, based on the at least one safety-related parameter that the first protect path acquires, identifying, by the second protect path, the hazardous situation, independently of the control path and first protect path, based on the at least one safety-related parameter that the second protect path acquires, or a combination thereof,
 wherein the first protect path, the second protect path, or the first protect path and the second protect path are configured in accordance with a safety category that has higher security requirements than a safety category, in accordance with which the control path is configured.

3. The magnetic resonance apparatus of claim 1, wherein the first protect path, the second protect path, or the first protect path and the second protect path are configured to transfer the magnetic resonance apparatus into a safe state when the first hazardous situation, the second hazardous situation, or the first hazardous situation and the second hazardous situation are identified.

4. The magnetic resonance apparatus of claim 1, wherein the second hazardous situation is the first hazardous situation.

5. The magnetic resonance apparatus of claim 1, wherein the control path, the first protect path, the second protect path, or any combination thereof:
- does not have overlaps; or
- has at least one overlap, the safety structure further comprising means for identifying a fault at the at least one overlap.

6. The magnetic resonance apparatus of claim 5, wherein the means for identifying a fault has at least one channel that is encoded to identify faults on a transfer path of the at least one overlap.

7. The magnetic resonance apparatus of claim 1, further comprising a system control unit separate from the safety-related function,
wherein the system control unit comprises at least one central monitoring unit configured to monitor the first protect path, the second protect path, or the first protect path and the second protect path.

8. The magnetic resonance apparatus of claim 7, wherein the system control unit comprises two units that are separated from one another,
wherein a first unit of the two units comprises parts of the control path,
wherein a second unit of the two units comprises parts of the first protect path, the second protect path, or the first protect path and the second protect path.

9. The magnetic resonance apparatus of claim 8, wherein the second unit comprises parts of the at least one central monitoring unit.

10. The magnetic resonance apparatus of claim 1, wherein the first protect path, the second protect path, or the first protect path and the second protect path have at least one local monitoring unit.

11. The magnetic resonance apparatus of claim 7, wherein only the first protect path has a central monitoring unit, and only the second protect path has a local monitoring unit.

12. The magnetic resonance apparatus of claim 7, wherein the first protect path has a first central monitoring unit, and the second protect path has a second central monitoring unit.

13. The magnetic resonance apparatus of claim 10, wherein the first protect path has a first local monitoring unit, and the second protect path has a second local monitoring unit.

14. The magnetic resonance apparatus of claim 7, wherein the at least one central monitoring unit comprises at least one programmable logic element.

15. The magnetic resonance apparatus of claim 10, wherein the at least one local monitoring unit comprises at least one programmable logic element.

16. The magnetic resonance apparatus of claim 1, wherein the safety-related function relates to a generation of a magnetic field, a radiofrequency signal, or the magnetic field and the radiofrequency signal.

17. The magnetic resonance apparatus of claim 16, wherein, for generating the magnetic field, the magnetic resonance apparatus comprises at least one gradient amplifier and at least one gradient coil,
wherein the at least one gradient amplifier is configured to supply the at least one gradient coil with a gradient current, and
wherein the at least one safety-related parameter characterizes the gradient current.

18. The magnetic resonance apparatus of claim 16, wherein, for generating the radiofrequency signal, the magnetic resonance apparatus comprises at least one radiofrequency amplifier and at least one radiofrequency antenna,
wherein the at least one radiofrequency amplifier is configured to supply the at least one radiofrequency antenna with a radiofrequency output, and
wherein the at least one safety-related parameter characterizes the radiofrequency output.

19. The method of claim 2, further comprising transferring the magnetic resonance apparatus into a safe state when the hazardous situation is identified.

20. The method of claim 2, wherein the first protect path, the second protect path, or the first protect path and the second protect path are tested regularly with regard to hidden faults.

* * * * *